United States Patent [19]
Takahashi et al.

[11] Patent Number: 5,783,772
[45] Date of Patent: Jul. 21, 1998

[54] LEAKAGE RADIATION PREVENTING ELEMENT

[75] Inventors: Michiharu Takahashi, Yachiyo; Hitoshi Komine, Bunkyo-ku; Yuji Ichikawa, Adachi-ku, all of Japan

[73] Assignee: Uro Denshi Kogyo Kabushiki Kaisha, Tokyo-To, Japan

[21] Appl. No.: 726,493

[22] Filed: Oct. 7, 1996

[30] Foreign Application Priority Data

Apr. 9, 1996 [JP] Japan .................. 8-086794

[51] Int. Cl.$^6$ ............................. H05K 9/00
[52] U.S. Cl. ................ 174/35 R; 333/12; 174/152 R
[58] Field of Search ................... 361/307, 816, 361/818; 174/152 R, 152 GM, 143, 35 R; 333/182, 183, 12; 336/84 R, 84 C, 84 M

[56] References Cited

U.S. PATENT DOCUMENTS

| | | | |
|---|---|---|---|
| 4,845,447 | 7/1989 | Holdsworth | 333/167 |
| 4,952,896 | 8/1990 | Dawson, Jr. | 333/182 |
| 5,091,707 | 2/1992 | Wollmerschauser et al. | 333/12 |
| 5,329,066 | 7/1994 | Hansson | 174/151 |
| 5,333,095 | 7/1994 | Stevenson et al. | 361/302 |
| 5,557,074 | 9/1996 | Miyamoto et al. | 174/152 GM |

*Primary Examiner*—Kristine L. Kincaid
*Assistant Examiner*—Hung V. Ngo
*Attorney, Agent, or Firm*—Jacobson, Price, Holman & Stern, PLLC

[57] ABSTRACT

A novel leakage radiation preventing element effectively prevents radio waves from being radiated from an electronic appliance, without depending upon a capacitor or a choke coil. The leaked current $I_{os}$ and $I_{or}$ generated from a hole or a gap formed in a casing or a chassis is introduced into a wave guide path and then attenuated by radio wave absorption function of a magnetic substance disposed therein. A coaxial conductor (2) is passed through a hole (107) formed in a chassis (3). The wave guide path (104) is formed between the chassis and a conductive disk (101) electrically floated from the chassis. A radially outward end of the wave guide path (i.e., the outer circumferential end of the conductive disk) is shorted to the chassis at high frequency, and further the inside of the wave guide path is filled with a ferrite ring (102). Therefore, when being propagated along the wave guide path, the high frequency current leaked from the hole or gap of the chassis is absorbed by the ferrite ring, without being radiated to the outside.

11 Claims, 13 Drawing Sheets

A-A

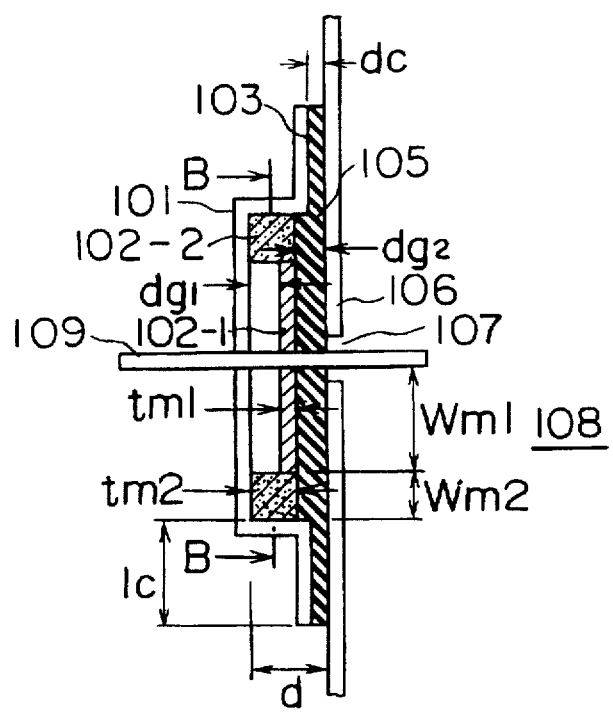
F I G. 8(a)
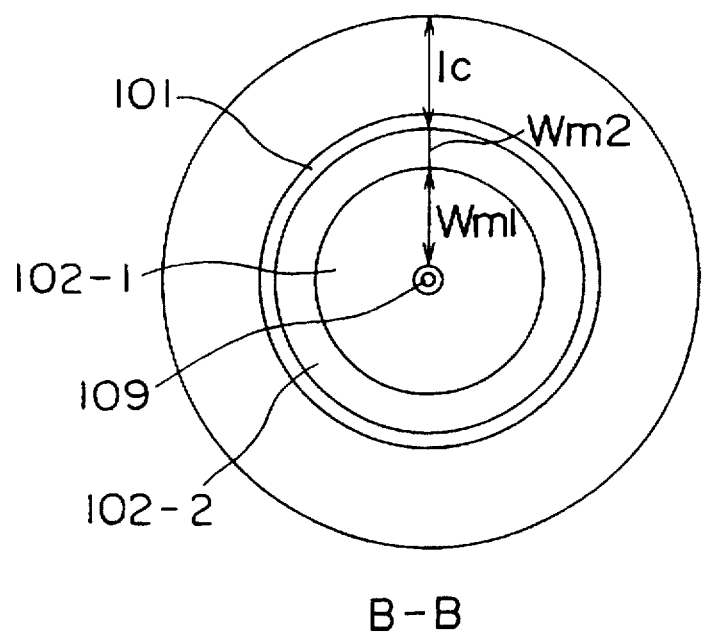
B-B
F I G. 8(b)

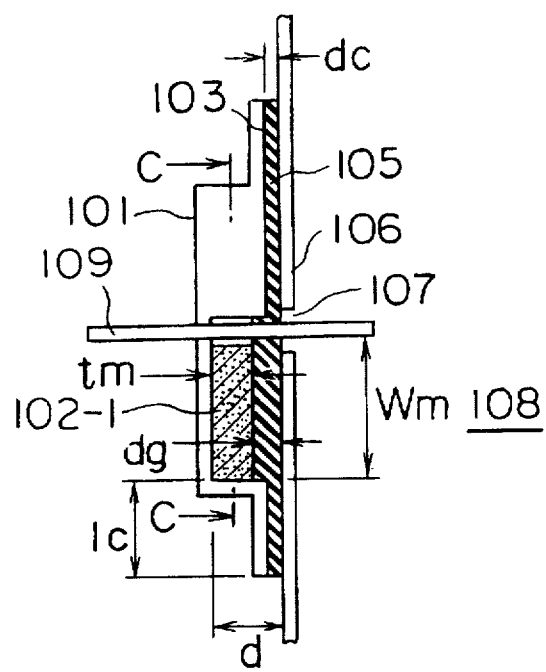
F I G. 10 (a)
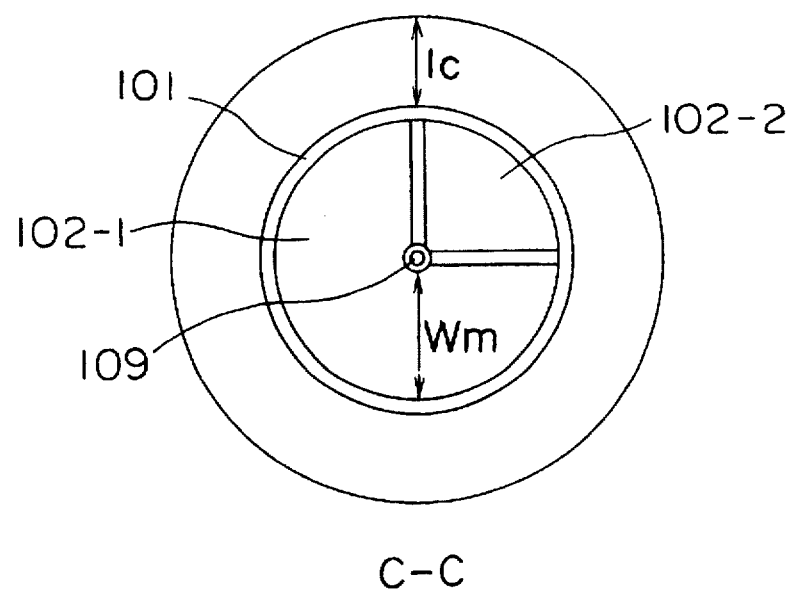
C-C
F I G. 10 (b)

LEAKAGE RADIATION PREVENTING ELEMENT

BACKGROUND OF THE INVENTION

1. Field of the Invention

The present invention relates to a leakage radiation preventing element for preventing a leakage current or leakage radio waves from being radiated from a wire lead-out portion of an electronic appliance, for instance.

2. Description of the Prior Art

When wires or a coaxial cable such as voltage supply lines, input/output lines, control lines, etc. is led out of a casing or a chassis of an electronic appliance, usually a hole is formed on a wall surface of the casing or the chassis thereof to lead out these wires. In this case, a leakage radiation preventing element is used to prevent electromagnetic waves (referred to as radio waves, hereinafter) generated inside the casing from being leaked through the wire hole; in contrast with this, to prevent external interference radio waves, noises, abnormal voltages from flowing into the casing. As a typical example of these leakage radiation preventing elements, the necessity and the utilizing method of a cable television protector (grounding block) will be explained in detail hereinbelow.

In the case of the cable television, a cable television protector is interposed between the cable television (referred to as TV, hereinafter) facility and subscriber terminals, in order to prevent abnormal current (e.g., generated by lightning surge) from flowing from the facility side to the subscriber side and simultaneously to prevent leakage current of a commercial power frequency generated by the electronic appliances disposed on the subscriber side flowing from the subscriber side to the facility side both through the cable television lead-in wire.

Further, on both sides of the input and output of the cable television protector, an inner conductor and an outer conductor of a coaxial cable are insulated from each other from the dc standpoint, respectively. Further, in order to float the outer conductor of the coaxial cable from the chassis from the dc standpoint, in usual a gap is formed between the outer conductor and the chassis, and an insulator is disposed in the formed gap so as to fix an output connector to the chassis.

As a result, since the general coaxial propagation mode cannot be established at this gap portion between the cable outer conductor and the chassis, high frequency current easily leaks from the formed gap; flows along an outer surface of the outer conductor of the coaxial cable connected to an outer casing of the protector; and then is radiated therefrom to the outside. As described above, the undesired radiation is caused by the presence of a gap or a hole formed to lead out a wire or a coaxial cable from the casing of the electronic appliance to the outside thereof.

The above-mentioned undesired radiation due to leakage current is generated in various other electronic appliances. In this case, the leakage current is caused mainly by the presence of many gaps and holes formed in the casing of the electronic appliance in the same way as with the case of the protector. In addition, the undesired radiation due to the leakage current interferes with the other appliances, and thereby causes a ghost trouble therein.

For instance, in the case of the cable television facility, when an abnormal voltage such as lightning surge voltage is generated from a head end or an equipment (e.g., a power source for supplying a voltage to a trunk line or amplifiers) of the cable TV facility, since the generated abnormal voltage is applied to the subscriber side, there exists a problem in that the electronic appliances such as television sets cause trouble. In order to prevent the above-mentioned problem, it is necessary to design the protector in such a way that only the high frequency signals such as TV signals can easily flow to the subscriber terminal, without flowing the abnormal voltage thereto. At the same time, it is also necessary to prevent radio waves from leaking and flowing from the home electronic appliance such as TV set of mal-insulation to the cable television facility through the cable television lead-in wire.

The frequency of the radio waves generated by the home electronic appliance is mainly composed of the ordinary commercial power frequency of 50 Hz or 60 Hz and other high frequency of several hundred Hz generated by inverters, for instance. In addition, although a lightning surge includes considerably high frequency, since the frequency components having a large energy are a direct current component or very low frequency components in comparison with the high TV signal frequency, the lightning surge can be dealt as direct current.

Accordingly, in order to minimize the trouble caused by the abnormal voltage generated from both the sides of the facility and the subscribers, it is usual to provide the protector between the subscriber terminals and the facility terminal in the cable television facility. For the above-mentioned purpose, in the protector, a capacitor having an appropriate capacitance is connected between the two coaxial cable wires on the output side of the facility, to insulate the both the wires from the dc standpoint; that is, to prevent the commercial frequency current or lightning surge current from flowing between the both, while passing only the cable TV signals of high frequency components without causing any troubles.

A structural concept of the prior art protector manufactured in accordance with the above-mentioned object will be described in further detail hereinbelow with reference to FIG. 12. In the actual structure, two input and output connectors are attached to a bottom surface of a short cylindrical metal casing, and necessary parts are assembled inside this cylindrical metal casing. Here, however, the output connector is not directly attached to the bottom surface of the casing, but attached thereto via an insulator interposed between the outer circumference of the output connector and the bottom surface of the cylindrical metal casing.

In more detail, in FIG. 12, an input terminal 1 is a coaxial connector referred to as F type connector in general, which is used to supply multi-channel TV signals for cable TV from the facility side to the subscriber side through the subscriber lead-in coaxial cable. In this case, the lead-in coaxial cable is connected to the input terminal 1 by use of a connector. The input terminal 1 is mechanically fixed to a chassis 3 of the protector body, and further connected thereto electrically. As described above, the TV signals introduced into the inside 5 of the protector flow through an inner conductor 1' of the connector 1 to an inner conductor 2' of an output connector 2 through a dc insulating capacitor 4. Further, the TV signals are transmitted to the subscriber TV sets through the subscriber lead-in coaxial cable connected by use of a coaxial connector similar to the input terminal 1 (i.e., F type connector).

In this case, although the high frequency TV signals introduced into the protector through the outer conductor 1' of the input terminal 1 flows along the chassis 3, since the outer conductor 2' of the output connector 2 is insulated from the chassis 3 by an insulator 8 attached between the output connector 2 and the chassis 3 so as to surround the connector 2, the TV signals flows to the outer conductor 2' of the connector 2 through a capacitor 9, and then reaches the subscriber TV set through a coaxial cable connected to the subscriber TV set by use of a coaxial connector similar to that used for the input terminal 1 (i.e., F type connector).

In the above-mentioned protector, in order to prevent the inside of the protector from being exposed to the radio waves propagating from the external air, the protector is usually shielded by a conductive cover 6. Further, a fuse (the current rating is about three ampere) 7 is connected in series to the capacitor 4 to immediately cut off and protect the circuit in case an over current flows therethrough.

In addition, in the prior art protector, an arrester (discharge element) which starts to discharge at about 150 volt is interposed between the inner conductor 1' of the input terminal 1 and the chassis 3 in order to increase the safety when an abnormal voltage such as lightning surge flows into the inner conductor 1' of the input terminal 1. Further, although there exists such a case that an insulating high frequency transformer is used instead of the capacitor 4, in this case, the essential function as the protector is basically the same as above, that is, to insulate both the outer and inner conductors of the two coaxial cables from the dc standpoint on both the input and output sides of the protector.

As described above, in the prior art protector, although the high frequency TV signals entering the input connector 1 can pass between the input and output sides, both the abnormal voltages applied from the subscriber side to the facility side or vice versa can be blocked from the dc standpoint by use of the capacitor 4 connected to the inner conductor 2' of the output connector 2 or the capacitor 9 connected to the outer conductor of the output connector 2. As a result, it is possible to prevent the abnormal voltage from flowing mutually between the facility side and the subscriber side.

Here, without being limited only to the cable TV facility, the undesired radio waves must be prevented as much as possible from being radiated from all the electronic appliances or systems. This is because, in case undesired waves leak, there exists such a probability that radio wave interference occurs in various important facilities using radio waves such as a navigation control system. Further, when the electronic appliance radiates undesired radio waves, this implies that this electronic appliance is easily subjected to the harmful influence of external radio wave interference. On the other hand, in the recent electronic appliances, as represented by portable telephone sets, very weak signals must be received in spite of the fact that the size, weight and power consumption thereof are all minimized. Therefore, it is necessary to suppress the leakage of the radio waves radiated from the electronic appliances or the facilities at as extremely small a level as possible, under due consideration of the radio wave interference upon the other appliances and systems.

Further, when the cable TV is connected to a home and thereby undesired radio waves are generated, there arise various problems in that the other electronic appliance is operated erroneously or the ghost appears in the TV screen due to the undesired radio waves. Here, the ghost is to generate overlapped picture on the TV screen when the TV signals directly received by a broadcasting antenna and then incoming through the leakage portion of the appliance are synthesized with the TV signals indirectly distributed from the cable TV facility to the appliance.

Further, on the other hand, the transmission frequency required for the recent cable TVs becomes as wide a band as 5 to 1000 MHz with the advance of multi-channel requirements. When radio waves of high frequency are used, since there exist higher harmonics of the fundamental frequency thereof, the frequency of the radio waves probably emitted becomes very high. This is one of the reasons why it is difficult to prevent the undesired radio waves from being radiated from the electronic appliances. Further, the radiation of the undesired radio waves is subjected to the influence of a small gap formed in the appliance casing or the wires led out of the appliance casing. On the other hand, however, the wires are indispensable to supply voltage and input/output signals, and further there exist many cases where holes are often formed in the appliance casing to pass the wires therethrough. As a result, it is important to prevent undesired radio waves from being radiated form these holes formed in the chassis or the casing of the electronic appliances.

FIG. 13 shows the flow of the high frequency current of the prior art cable TV protector shown in FIG. 12, in which the same reference numerals have been retained for similar parts having the same functions as with the case of the protector shown in FIG. 12. Further, even in the case of the ordinary wire (not the coaxial cable), since the outer conductor of the coaxial cable is considered as the ordinary cable, it is possible to check the leakage current from the hole in the same way as with the case of the coaxial cable. Here, however, the leakage current of the coaxial cable will be explained hereinbelow with reference to FIG. 13.

In FIG. 13, $I_{ii}$ denotes a high frequency current flowing from the input terminal (input connector) 1 to the output terminal (output connector) 2 through the inner conductor 1' of the input connector 1; and $I_{io}$ denotes current flowing from the outer conductor of the input terminal 1 to the chassis 3. The phase of the current $I_{io}$ is different roughly 180 degrees from that of the current $I_{ii}$.

Here, when current $I_{io}$ flowing along the outer conductor of the input terminal 1 is taken into account to examine the leakage current from the protector, the current flowing normally from the input connector along the inner surface of the outer conductor of the input connector 1 as the coaxial mode current reaches the capacitor 9 along the inner surface of the chassis 3 of the protector. Here, the current $I_{io}$ is divided into current $I_{oc}$ flowing through the capacitor 9 and current $I_{os}$ flowing from the position of the capacitor 9 to the outer surface of the chassis 3 through an insulating substance 8. That is, the current can be expressed as $I_{io}=I_{oc}+I_{os}$. In this case, the ratio of two currents can be decided on the basis of the impedance ratio of the outer wall side of the chassis 3 to the capacitor 9. Here, since the impedance of the capacitor 9 is generally high at the lower frequency of the cable TV band, the current rate $I_{os}$ seems to become large at the low frequency, as compared with at the high frequency. However, since being subjected to the influence of the impedance on the outer wall side of the chassis, in general, the current rate $I_{os}$ seems to fluctuate largely on the basis of the frequency in relation to the length of the coaxial cable connected to the input side.

On the other hand, the current $I_{oc}$ flowing to the output side through the capacitor 9 is divided into current $I_{or}$ flowing along the outer surface of the outer conductor of the output connector 2 and the current $I_{oo}$ flowing along the inner surface of the outer conductor of the output connector 2, at the inner end surface of the output connector 2 inside the protector. Here, the current ratio seems to fluctuate largely on the basis of the frequency in relation to the length of the coaxial cable connected to the output side. In any case, since the current to be actually supplied to the subscriber side is only the current $I_{oo}$ and further the current $I_{oc}$ can be expressed as $I_{oc}=I_{oo}+I_{or}$, the two current $I_{os}$ and $I_{or}$ become loss on the input and output sides, respectively.

In general, since the current flowing through the inner conductor of the coaxial cable is equal to the current flowing along the inner surface of the outer conductor of the coaxial cable, $I_{oi}=I_{ii}-I_{os}-I_{or}=I_{oo}$ can be established. Here, it should be noted that although the current flowing along the outer surface of the protector is $I_{os}$ and $I_{or}$, the current $I_{os}$ flows along the chassis surface of the protector and the surface of the outer conductor of the input connector 1, and then is radiated to the air by using the surface of the outer conductor of the lead-in wire connected to the input connector as an antenna. In the same way, the current $I_{or}$ flowing along the surface of the outer conductor of the output connector 2 is radiated from the coaxial cable connected thereto and further enters the subscriber side.

SUMMARY OF THE INVENTION

With these problems in mind, therefore, it is the object of the present invention to provide a leakage radiation preventing element which can prevent leakage radio waves from being radiated to the outside more effectively, as compared with the prior art element using capacitors and choke coils as the preventing elements.

To achieve the above-mentioned object, the present invention provides a leakage radiation preventing element, comprising: a coaxial conductor composed of an inner conductor and an outer conductor and disposed so as to pass through a chassis of an electronic appliance electrically insulated from the chassis; a conductive disk connected to the outer conductor of said coaxial conductor and extending roughly in parallel to the chassis so as to form a space between said conductive disk and the chassis by surrounding said coaxial conductor concentrically; and a magnetic substance formed of ferrite and inserted in the space so as to surround said coaxial conductor concentrically.

Further, the present invention provides a leakage radiation preventing element disposed between a cable television subscriber terminal and a lead-in wire so as to be used as a protector, which comprises: a conductive disk attached concentrically to an outer conductor of a coaxial connector electrically insulated from a chassis or a casing of the protector from dc standpoint; and a magnetic substance interposed between said conductive disk and the chassis or the casing of the protector.

Here, it is preferable that a gap or a dielectric substance is inserted between the chassis and said conductive disk and further between the chassis and said magnetic substance.

Further, it is preferable that an electric capacitance is additionally disposed between said conductive disk and the chassis.

Further, the present invention provides a leakage radiation preventing element, which comprises: a ring-shaped magnetic substance formed with at least one slit extending in thickness direction or in radial direction thereof, the slit being filled with a conductive plate, and a wire led from a casing of an electronic appliance to an outside of the casing being passed through a roughly central portion of said magnetic substance; and a conductive disk arranged concentrically with said magnetic substance and connected to the conductive plate.

Here, it is preferable that said magnetic substance is formed by arranging a plurality of magnetic substances having a different axial thickness, respectively at a multi-stage in a radial direction thereof.

When the outer conductor of the connector is floated from the casing from the dc standpoint, current leaks from a gap formed in the casing and thereby radio waves are radiated therefrom. In the leakage radiation preventing element according to the present invention, the leakage current is introduced into the wave guide path for attenuation. In this case, as far as the current leaked from the gap can be introduced into the wave guide path, any shape or any construction of the wave guide path can be adopted in relation to the gap. For instance, the wave guide path can be formed between the chassis and the conductive disk.

Further, the radially outward end (the outer circumference of the disk) of the conductive path is shorted to the chassis at high frequency, and further a ferrite magnetic substance is disposed in the wave guide path. Therefore, the high frequency radio waves leaked from the gap of the chassis can be absorbed by the ferrite magnetic substance when propagating radially along the wave guide path, so that it is possible to prevent the high frequency radio waves from being radiated.

Being different from the prior art methods such that a choke coil is connected in series or that a capacitance is used for bypassing or filtering leakage radiation, since the method of absorbing radio waves by use of a magnetic substance is adopted in the present invention, it is possible to effectively prevent radio waves from being radiated from a hole or a gap of the electronic appliance.

Further, in the leakage radiation preventing element according to the present invention, when a gap is formed between the magnetic substance inserted into the wave guide path and the inner surface of the wave guide path, it is possible to prevent radio waves from being leaked in a wider frequency band, as compared with when no gap is formed therebetween.

Further, to short the end of a wave guide at high frequency, a capacitance can be formed between the radially outward end of the wave guide path and the chassis. In this case, another radio wave concentrating part (e.g., capacitor) can be also used.

BRIEF DESCRIPTION OF THE DRAWINGS

FIG. 8(a) is a cross-sectional view showing a third embodiment of the leakage radiation preventing element according to the present invention, in which two stage magnetic substances are arranged;

FIG. 8(b) is a cross-sectional view taken along the line B—B shown in FIG. 8(a);

FIG. 10(a) is a cross-sectional view showing a fourth embodiment of the leakage radiation preventing element according to the present invention, in which divided magnetic substances are arranged;

FIG. 10(b) is a cross-sectional view taken along the line C—C shown in FIG. 10(a);

DETAILED DESCRIPTION OF THE PREFERRED EMBODIMENTS

Figure 1:
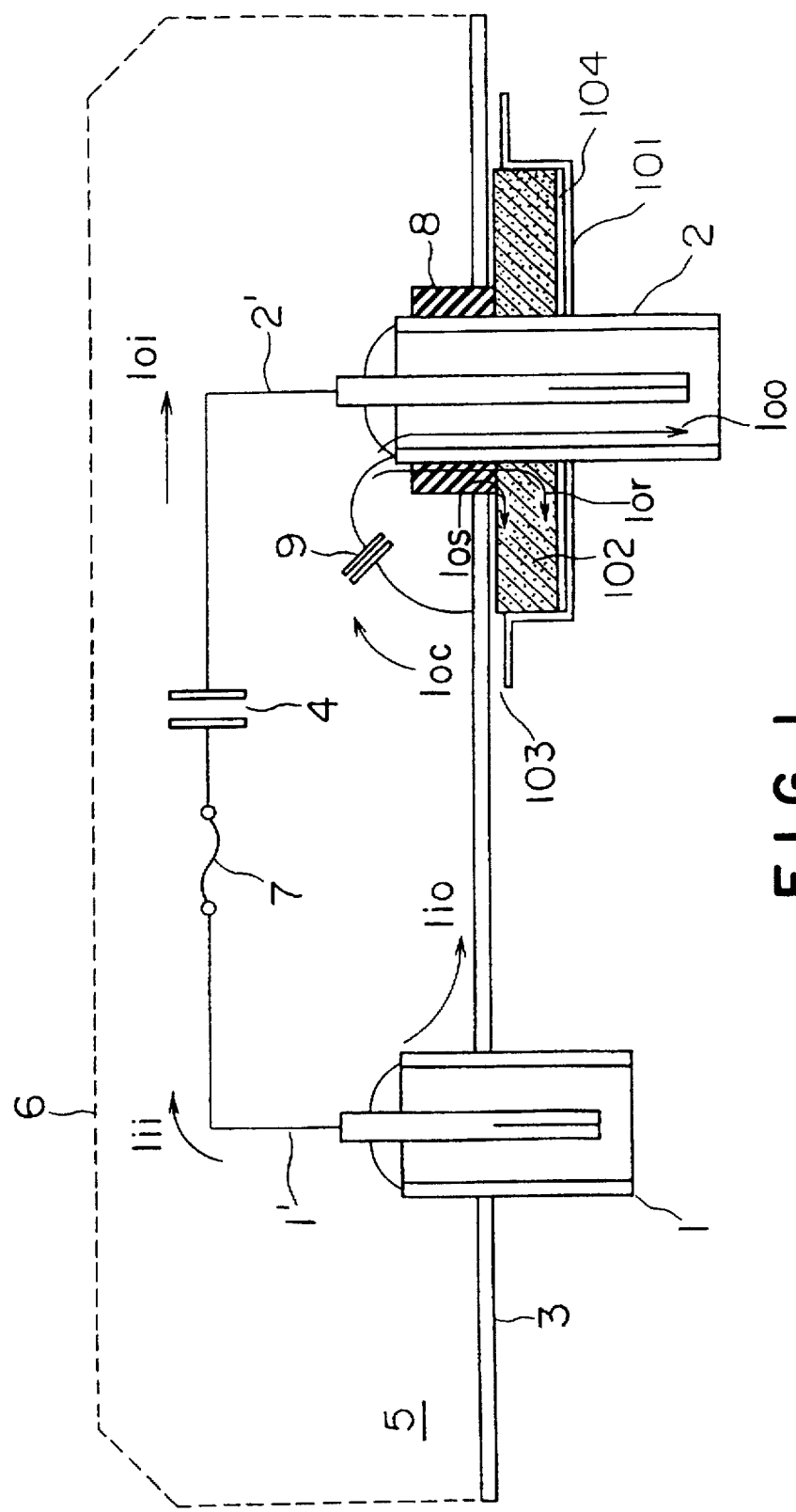
FIG. 1 is a cross-sectional view for assistance in explaining the fundamental structure and function of the leakage radiation preventing element according to the present invention.

Embodiments of the leakage radiation preventing element according to the present invention will be described hereinbelow with reference to the attached drawings.

Prior to the description of the embodiments, the basic structure of the leakage radiation preventing element according to the present invention used as a cable TV protector will be described hereinbelow with reference to FIGS. 1 and 2. The protector shown in FIG. 1 is different from the prior art protector shown in FIG. 12 in that the protector further comprises a wave guide path 104, a ferrite ring 102 disposed in the wave guide path 104, and a capacitance 103 formed at the radially outward end of the wave guide path 104.

In more detail, the wave guide path 104 is formed between a conductive disk 101 and a chassis 3. The conductive disk 101 is formed with a central hole having an inner diameter equal to an outer diameter of an outer conductor of an output connector 2, concentrically therewith. The outer circumference of the outer conductor of the output connector 2 is in tight contact with the conductive disk 101. Further, the conductive disk 101 is kept at a constant distance away from and in parallel to the chassis 3. Further, the ferrite ring 102 is inserted in the wave guide path 104, that is, between the conductive disk 101 and the chassis 3 so as to surround the output connector 2. Here, the radially outward end of the wave guide path 104 is formed by extending the conductive disk 101 as a flange in parallel to the chassis 3 so as to form a very small gap between the conductive disk 101 and the chassis 3, so that a small electric capacitance can be formed.

Figure 2:
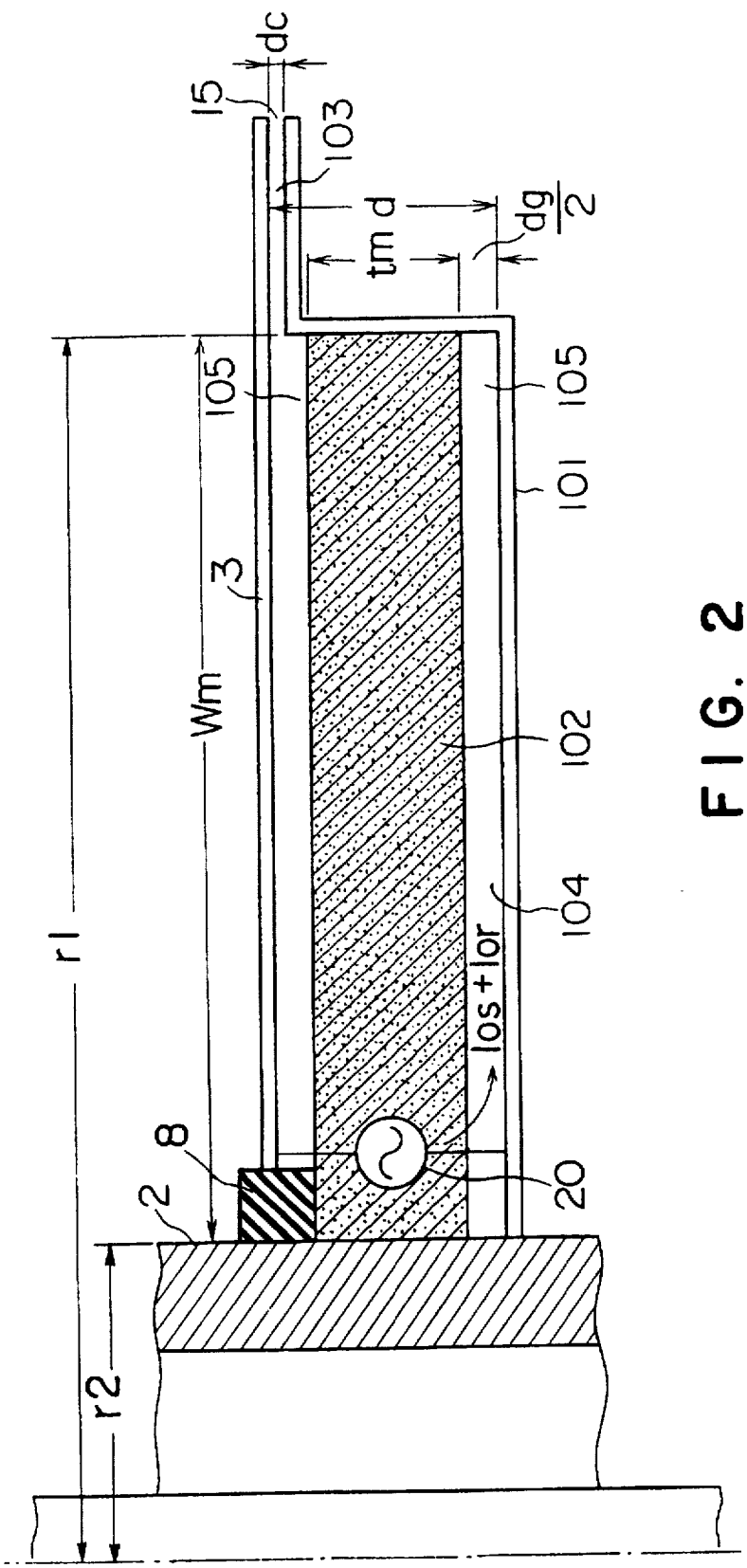
FIG. 2 is an enlarged cross-sectional view showing an essential portion of the element shown in FIG. 1.

FIG. 2 is an equivalent circuit for assistance in explaining the function of the leakage radiation preventing element according to the present invention constructed as described above, in which the same reference numerals have been retained for similar parts having the same functions as with the case shown in FIG. 1. Further, in FIG. 2, only the right side of the output connector 2 is shown for brevity. In practice, however, the wave guide path 104 as shown in FIG. 2 is formed so as to surround the output connector 2 as shown in FIG. 1.

Figure 13:
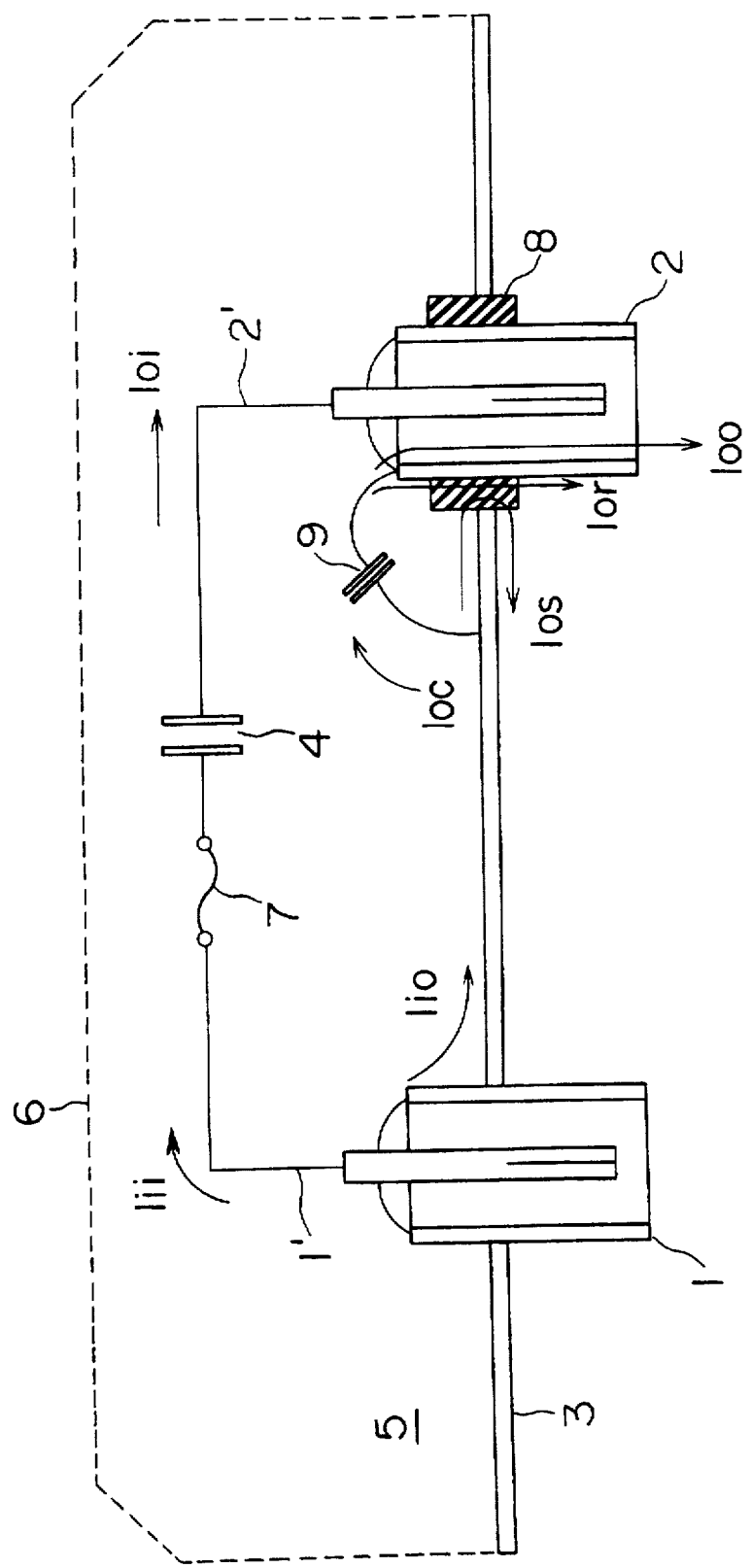
FIG. 13 is a similar view for assistance in explaining the current flows of the prior art cable TV protector shown in FIG. 12.

In FIG. 2, current $I_{os}$ leaks from the chassis 3 to the conductive disk 101 through an insulating substance 8, and current $I_{or}$ leaks from the outer surface of the outer conductor of the output connector 2 to the conductive disk 101, as already explained with reference to FIG. 13. In summary, both the currents $I_{os}$ and $I_{or}$ leak from an electrical gap (i.e., an insulating substance 8) formed between the chassis 3 and the outer conductor of the output connector 2. Further, in FIG. 2, the two leakage currents are replaced with a single current source 20.

Here, when the gap between the chassis 3 and the conductive disk 101 is filled with the ferrite ring 102, the characteristic impedance of the wave guide path 104 formed between the chassis 3 and the conductive disk 101 can be represented by the following formula:

$$Z_d = \frac{d^2 \mu_0 \mu_r}{2\pi^2(r_1^2 - r_2^2)\epsilon_0 \epsilon_r} \cdot \log\frac{r_1}{r_2} \tag{1}$$

where d denotes the space of the wave guide path; r1 denotes the radius of the conductive disk 101; and r2 denotes the radius of the output connector 2.

Here, as shown in FIG. 2, the radial width Wm of the ferrite ring 102 is equal to a difference between r1 and r2. Further, $\mu_0$ and $\epsilon_0$ denote the permeability and the dielectric constant of air; and $\mu_r$ and $\epsilon_r$ denote the relative permeability and the relative dielectric constant of the ferrite ring 102, respectively.

In the present invention, however, since there exist two gaps 105 each having a distance dg/2 between the ferrite ring 102 and the chassis 3 and between the ferrite ring 102 and the conductive disk 101, $\mu_r$ and $\epsilon_r$ become both small, as compared with when these gaps are filled with the ferrite ring 102. Therefore, in the present invention, the assumption is made that the gap is filled with an equivalent medium having an equivalent relative permeability $\mu_r$ and an equivalent relative dielectric constant $\epsilon_r$ including both the ferrite ring 102 and the actual gap 105.

Then, when $\mu_{er}$ and $\epsilon_{er}$ denote the equivalent relative permeability and the equivalent relative dielectric constant of this equivalent medium, respectively, and further when tm denotes the axial thickness of the ferrite ring 102 (i.e., magnetic substance); d denotes the space of the wave guide path 104 (i.e., between the conductive disk 101 and the chassis 3); and dg denotes the total gap between the chassis 3 and the ferrite ring 102, following formulae can be obtained:

$$\mu_{er} = (dg + \mu_r \cdot tm)/d \quad \epsilon_{er} = d \cdot \epsilon_r/(dg + \epsilon_r \cdot tm) \tag{2}$$

Therefore, the characteristic impedance of the wave guide path 104 can be expressed in accordance with the formula (1) and on the basis of the above-mentioned values.

Further, when dc denotes the space between the radially outward end of the wave guide path 104 and the chassis 3; and lc (See FIG. 3) denotes the radial length of the capacitance portion 103 filled with the medium of $\epsilon_c$, the capacitance of the capacitance portion 103 formed at the radially outward end of the wave guide path 104 can be roughly expressed as $$C = \pi(1c^2 + 2Wm \cdot 1c) \epsilon_c/dc \ [F/m] \tag{3}$$

Therefore, it is possible to obtain a large capacitance by decreasing dc and increasing $\epsilon_c$.

In general, the relative permeability $\mu_r$ and the relative dielectric constant $\epsilon_r$ can be expressed by a complex number, respectively as $$\mu_r = \mu_{r1} - j\mu_{r2} \quad \epsilon_r = \epsilon_{r1} - j\epsilon_{r2} \tag{4}$$

where $\mu_{r1}$ denotes the real number portion of the relative permeability $\mu_r$, and $\mu_{r2}$ denotes the imaginary number portion thereof; and $\epsilon_{r1}$ denotes the real number portion of the relative dielectric constant $\epsilon_r$, and $\epsilon_{r2}$ denotes the imaginary number portion thereof, respectively. Therefore, $\mu_r$ and $\epsilon_r$ have dispersive characteristics in dependence upon frequency.

When NiZn sintered ferrite is used and further the relative dielectric constant of the ferrite is measured by magnetizing it by applying a dc voltage, although the relative permeability of the ferrite material itself differs according to the materials, the value of $\mu_{r1}$ of the formula (4) is 10 to 2500 approximately. Further, the value of $\mu_{r2}$ is large when $\mu_{r1}$ is large. Here, both the values change according to frequency.

When the NiZn sintered ferrite is used, although the relative permeability of the ferrite material itself differs according to the materials, the value of $\epsilon_{r1}$ of the formula (4) is 12 to 15 approximately, without being subjected to the influence of frequency, so that the value of $\epsilon_{r2}$ is generally very small.

In the following description, the relative permeability and the relative dielectric constant indicate the real number portions $\mu_{r1}$ and $\epsilon_{r1}$ as expressed by the formula (4). Further, these values are assumed to be measured by applying a dc voltage thereto, as far as not particularly specified. Further, as the matter of course, the relative permeability $\mu_{re}$ and the relative dielectric constant $\epsilon_{er}$ both calculated on the basis of the above real number portions thereof have the dispersive characteristics according to frequency, respectively.

On the basis of the above-mentioned conditions, the impedance $Z_c$ obtained when seen from the current source side 20 to the magnetic substance (ferrite ring) side in FIG. 2 can be normalized by $Z_d$ as follows:

$$Zc = \frac{(Z1 + Zd \cdot \tanh\gamma \cdot Wm)}{(Zd + Z1 \cdot \tanh\gamma \cdot Wm)} \tag{5}$$

where $\gamma$ denotes a propagation constant of the medium as $$\gamma = j\omega(\mu_{er}\epsilon_{er})^{1/2}$$

and $\omega$ denotes the angular frequency. Further, the radially outward end capacitance 103 of the conductive disk 101 is a load impedance $Z_1$, which can be expressed by the formula (3).

Here, if $Z_c$ is 1, since this indicates that the leakage currents $I_{os}$ and $I_{or}$ propagate along the wave guide path 104 without any reflection, and are absorbed in the wave guide path, that is, converted into heat due to the magnetic loss of the ferrite ring 102, the radio waves will not be radiated from the casing to the outside.

Further, in the leakage radiation preventing element according to the present invention, it is not necessary that the axial thickness of the magnetic substance 102 inserted into the wave guide path 104 is uniformly constant in the radial direction of the casing. Rather, it is preferable to form a multi-stage magnetic substance by changing the axial thickness tm of the magnetic substance 102 stepwise and the radial width Wm thereof also stepwise in the radially outward direction from the central portion thereof, for instance in order to widen the frequency band thereof.

The essential structural features of the present invention can be summarized as follows:

(1) The hole or gap formed in a conductor (e.g., casing or chassis) through which radio waves may leak is filled with a conductive disk electrically insulated from the conductor in such a way as to form a wave guide path between the conductor formed with the hole or gap and the conductive disk.

(2) The magnetic substance is inserted into the formed wave guide path.

(3) A capacitance portion having a concentrated constant or a distributed constant is formed at the radially outward end of the wave guide path in such a way as to short the wave guide path at high frequency.

On the basis of the above-mentioned fundamental concepts, the following various embodiments can be constructed.

[First Embodiment]

Figure 3:
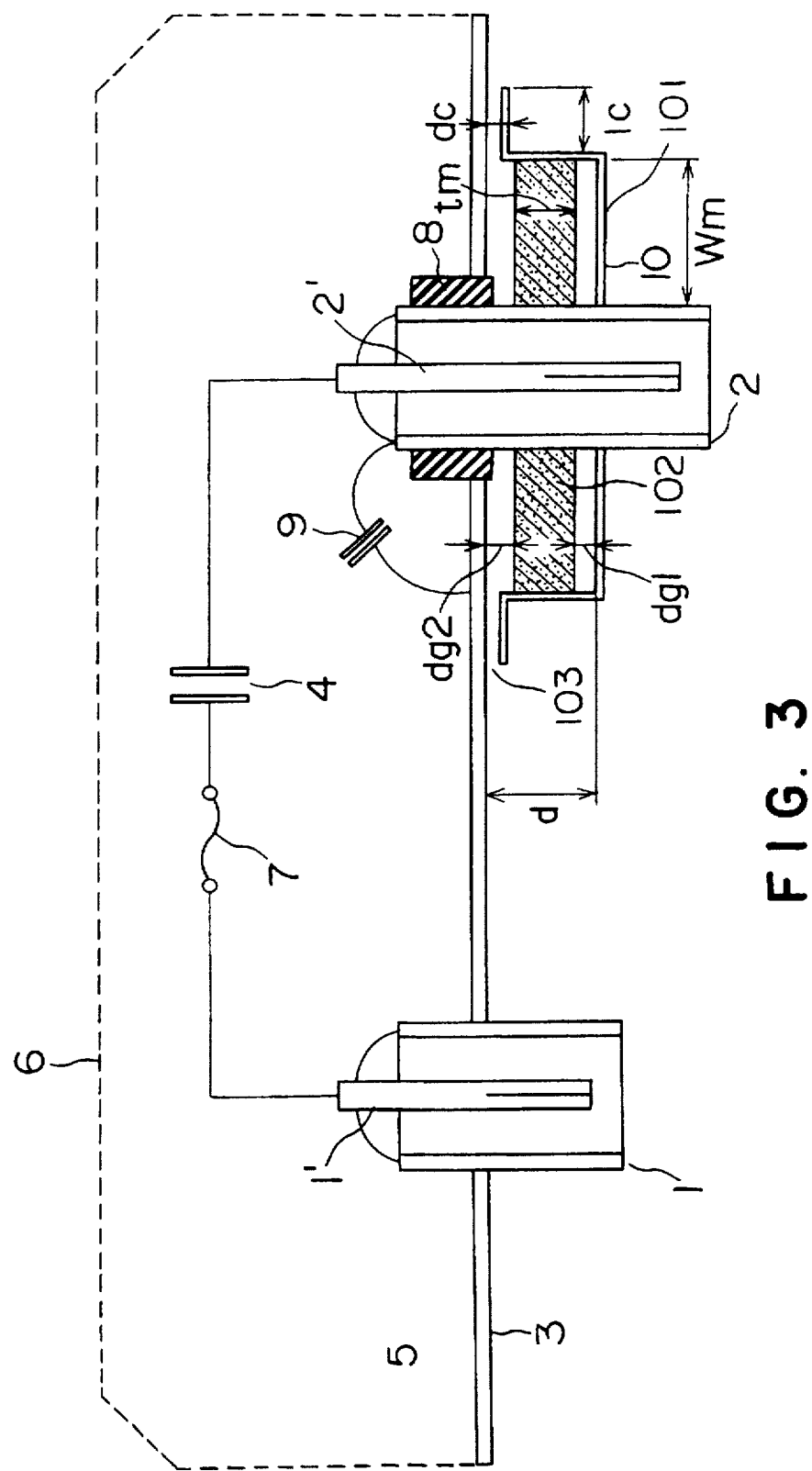
FIG. 3 is a cross-sectional view showing a first embodiment of the leakage radiation preventing element according to the present invention, in which a coaxial cable is used to supply power.

FIG. 3 shows the first embodiment of the leakage radiation preventing element according to the present invention. In FIG. 3, the chassis 3 is a stainless steel plate having a thickness of 0.8 mm and a diameter of about 60 mm. Further, two high frequency connectors 1 and 2 each having an outer diameter of about 10 mm are mounted on the chassis 3 about 28 mm away from each other, as input and output terminals, respectively.

The conductive disk 101 for constructing the wave guide path has a diameter of 25.2 mm. The space d between the conductive disk 101 and the chassis is set to 5 mm. Further, a capacitance portion 103 having a radial length lc of 5 mm is formed at a radially outward end portion of the conductive disk 101 concentrically with the conductive disk 101. Here, the space dc between the conductive disk 101 and the chassis 3 is 0.2 mm. Therefore, the outer diameter of the leakage radiation preventing element including this capacitance portion 103 is about 37 mm. The material of the ferrite ring 102 is NiZn sintered ferrite having a relative permeability $\mu_r$ of 2500 and a relative dielectric constant $\epsilon_r$ of 15.

The ferrite ring 102 inserted into the wave guide path is a ring formed with a central hole having a diameter of about 10 mm. The axial thickness tm of the ferrite ring 102 is 4 mm and an outer diameter thereof is 25.2 mm. Therefore, the radial width Wm of the ferrite ring 102 is about 7.6 mm. Further, the gap dg2 between the ferrite ring 102 and the chassis 3 is 0.5 mm, and the gap dg1 between the ferrite ring 102 and the conductive disk 101 is also 0.5 mm, so that the total gap (dg=dg1+dg2) of the two gaps is 1 mm.

In the above-mentioned construction, the equivalent relative permeability per in the wave guide path is about 2000, and the equivalent relative dielectric constant $\epsilon_{er}$ in the wave guide path is as low as about 3.95 due to the presence of the gap dg. Further, the capacitance at the radially outward end portion of the conductive disk 101 is about 20 pF.

Figure 4:
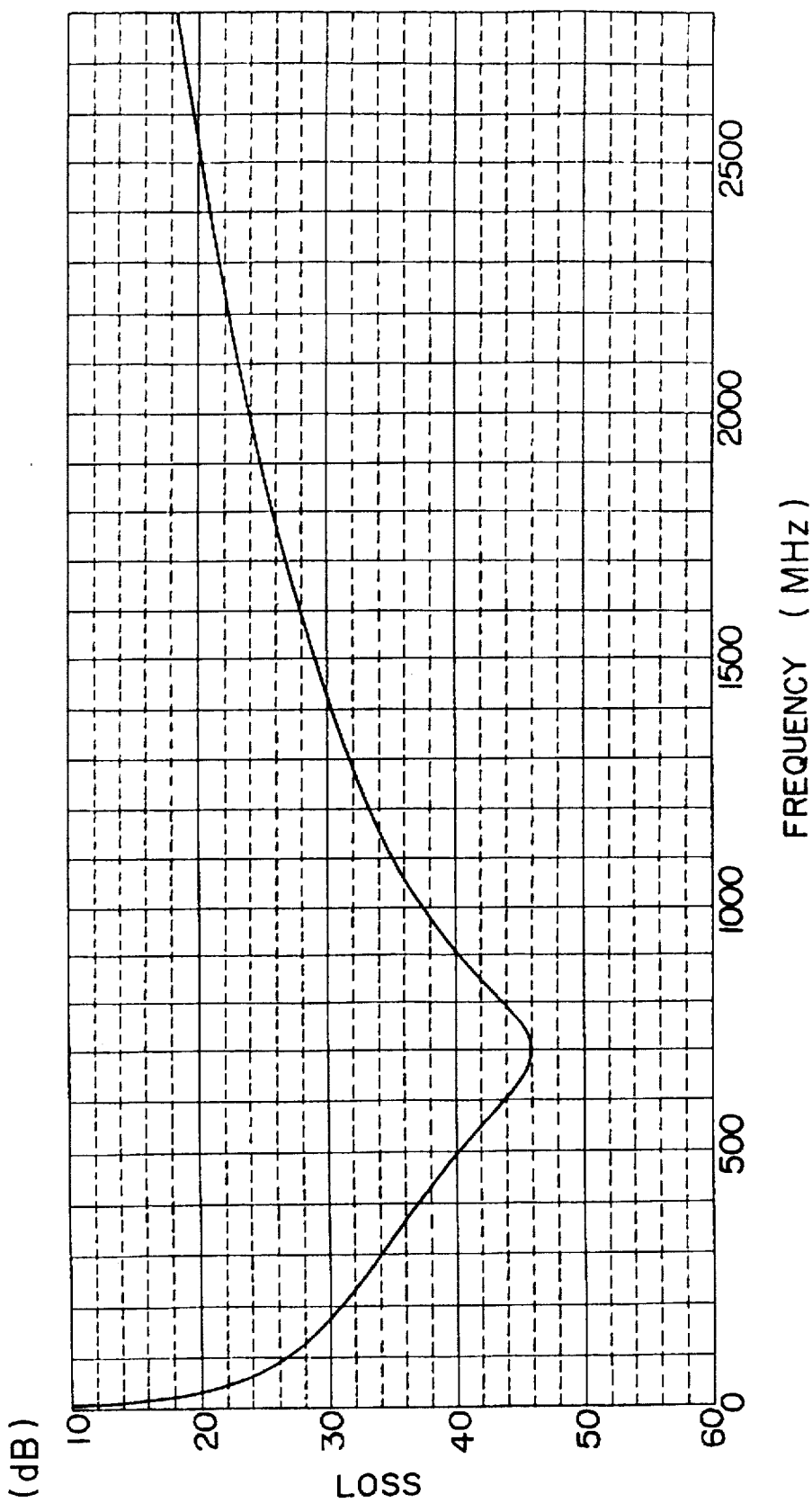
FIG. 4 is a graphical representation showing the actual reflective attenuation characteristics of the first embodiment shown in FIG. 3.
Figure 5:
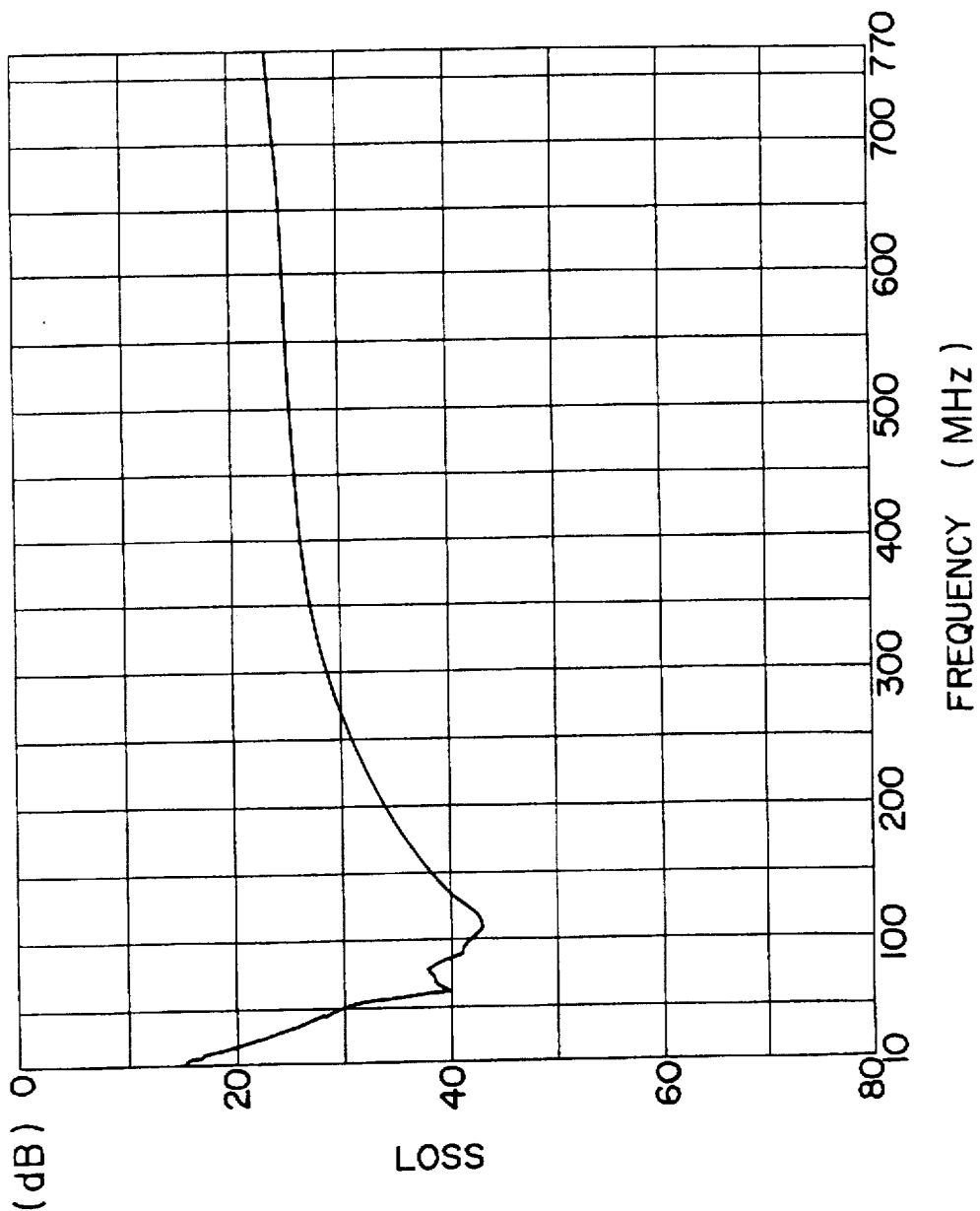
FIG. 5 is a graphical representation showing the leakage characteristics of the first embodiment shown in FIG. 3, in comparison with those of the prior art element shown in FIG. 12.
Figure 12:
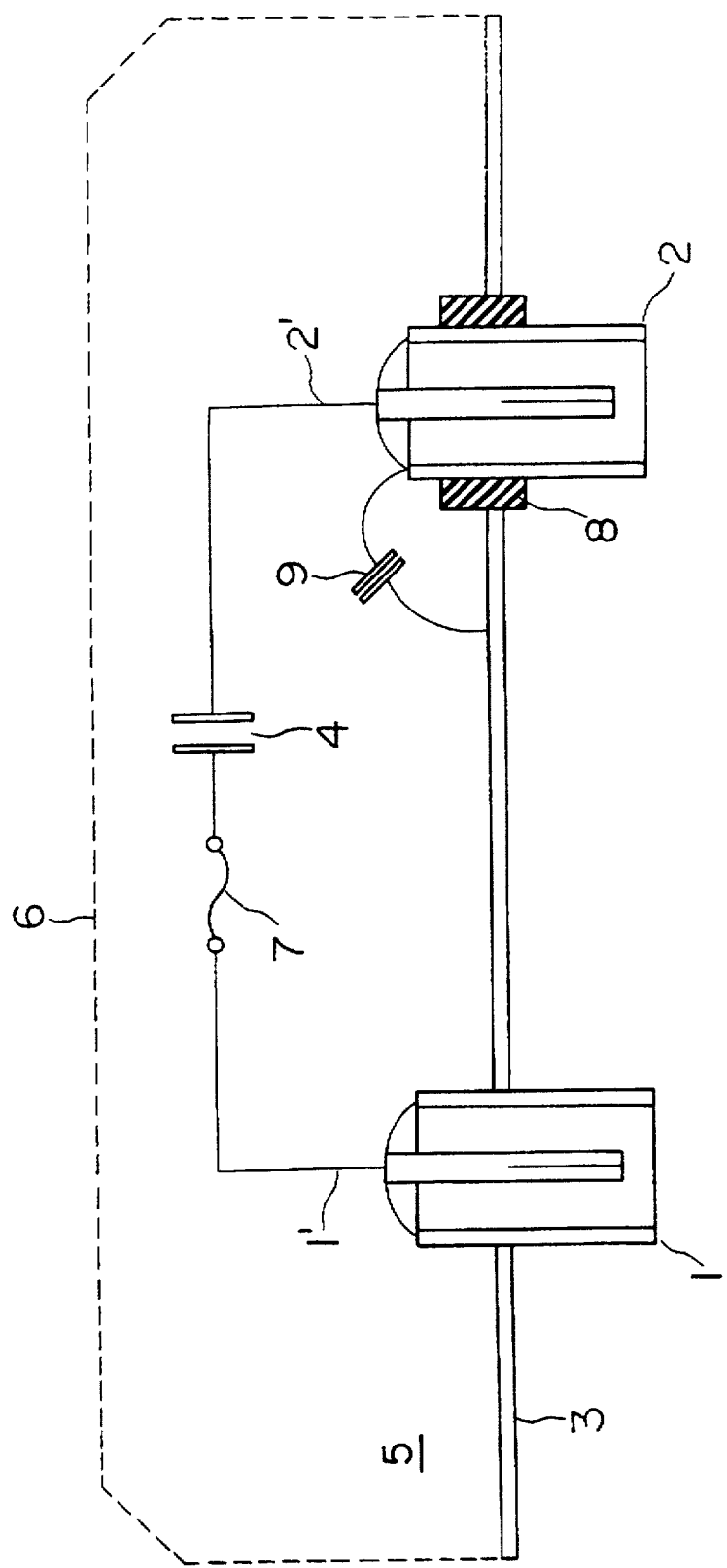
FIG. 12 is a conceptual view showing the structure of the prior art cable TV protector.

FIG. 4 shows the return loss characteristics of the leakage radiation preventing element constructed as shown in FIG. 3. FIG. 4 indicates that the return loss of the radio waves propagating in the radial direction from the central position of the ferrite ring 102 (the left side in FIG. 2) to the capacitance portion 103 is 20 dB or more in as wide a frequency range as between 30 and 2500 MHz. Further, FIG. 5 shows the improvement of the radio wave radiation rate of the embodiment shown in FIG. 3 in comparison with the radiation rate of the prior art leakage radiation preventing element as shown in FIG. 12, in which the improvement rate of the present embodiment is shown in unit of dB by setting the radiation rate of the prior art element to a reference radiation rate of 0 dB. FIG. 5 indicates that it is possible to improve the leakage radiation rate by about 30 dB at low frequency and about 20 dB or more at high frequency, in comparison with the prior art element.

[Second Embodiment]

Figure 6A:
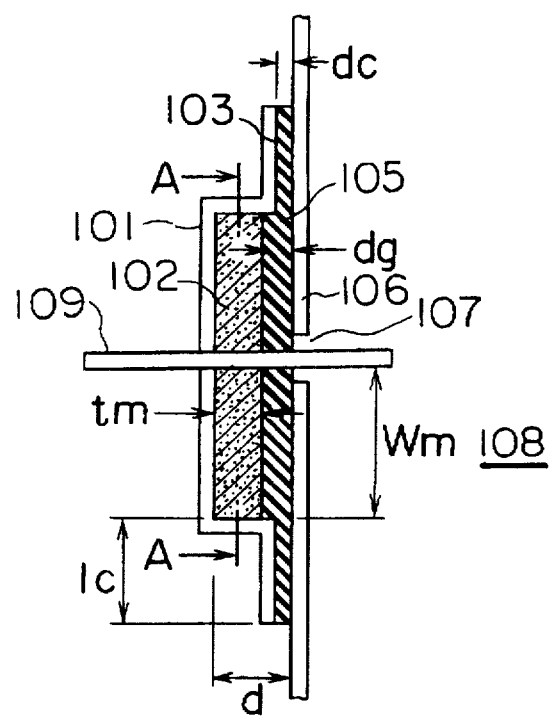
FIG. 6(a) is a cross-sectional view showing a second embodiment of the leakage radiation preventing element according to the present invention, in which a conductive rod is used to supply power.
Figure 6B:
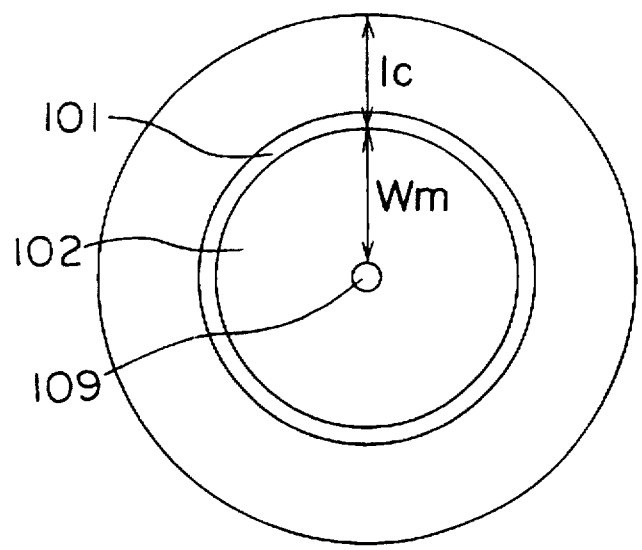
FIG. 6(b) is a cross-sectional view taken along the line A—A shown in FIG. 6(a)

FIGS. 6(a) and 6(b) show the second embodiment of the leakage radiation preventing element according to the present invention. In FIGS. 6(a) and 6(b), the preventing element is composed of the conductive disk 101, the ferrite ring 102, the capacitance portion 103 extending from the conductive disk 101, an insulating substance 105, a conductive rod 109, etc. Further, in FIG. 6(a), a wall surface (chassis surface) 106 of the casing of an electronic appliance is formed with a hole 107 for passing the conductive rod 109. Further, 108 denotes the inside of the casing.

In this second embodiment, since power is supplied to the inside 108 of the casing through the conductive rod 109, the leakage radiation preventing element according to the present invention is used to prevent high frequency radio waves from being leaked through the hole 107 for passing the conductive rod 109 from the inside 108 of the casing.

In FIG. 6(a), the power for the appliance is supplied from the left side of the conductive rod 109. Here, since the conductive rod 109 is soldered to the center of the conductive disk 101, leakage current flows radially from the center of the conductive disk 101 along the surface of the conductive disk 101; turns to the reverse side of the conductive disk 101 (i.e., to the side of the ferrite ring 102) passing through the outer circumference of the capacitance portion 103; enters the conductive rod 109 passing through the ferrite ring 102; and then flows to the inside 108 of the casing through the conductive rod 109 passing through the hole 107 formed in the casing wall surface 106.

Accordingly, although not shown, since the exposed portion of the conductive rod 109 and the conductive disk 101 are charged portion, it is necessary to cover the preventing element by use of an insulating substance of an appropriate shape for safety.

In FIGS. 6(a) and 6(b), the conductive disk 101 for constructing the wave guide path has a diameter of 15.8 mm, and the space d between the conductive disk 101 and the casing wall surface 106 is set to 2 mm. Further, a capacitance portion 103 having a radial length lc of 5 mm is formed at a radially outward end portion of the conductive disk 101 concentrically therewith. Here, the space dc between the conductive disk 101 and the casing wall surface 106 is 0.2 mm and filled with an insulating substance 105.

The material of the ferrite ring 102 is NiZn sintered ferrite having a relative permeability $\mu_r$ of 2500 and a relative dielectric constant $\epsilon_r$ of 15.

The ferrite ring 102 is a ring formed with a central hole having a diameter of about 0.6 mm. The axial thickness tm of the ferrite ring 102 is 1.6 mm and the outer diameter thereof is 15.8 mm. Therefore, the radial width Wm of the ferrite ring 102 is about 7.6 mm. Further, the ferrite ring 102 is in tight contact with the conductive disk 101 in the axial thickness direction thereof, and further in tight contact with the casing wall surface 106 via the insulating substance 105 having a thickness dg of 0.4 mm.

In the above-mentioned construction, the equivalent relative permeability per in the wave guide path is about 2000, and the equivalent relative dielectric constant $\epsilon_{er}$ in the wave guide path is about 4. Further, the capacitance at the radially outward end portion of the conductive disk 101 is about 30 pF.

Figure 7:
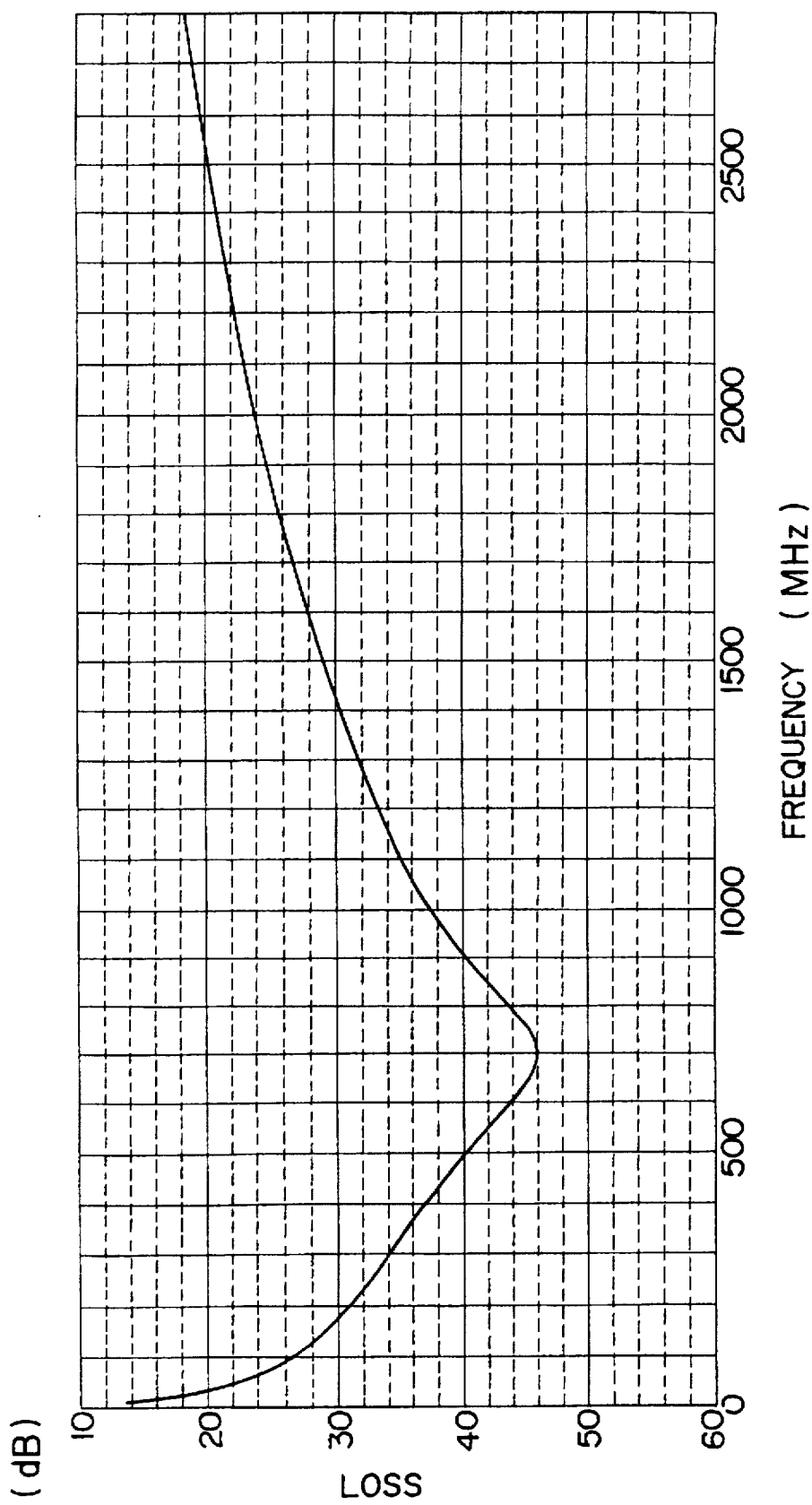
FIG. 7 is a graphical representation showing the actual reflective attenuation characteristics of the second embodiment shown in FIGS. 6(a) and 6(b)

FIG. 7 shows the absorption characteristics of the leakage radiation preventing element constructed as shown in FIGS. 6(a) and 6(b). FIG. 7 indicates that the return loss of the radio waves propagating in the direction of the capacitance portion 103 through the ferrite ring (magnetic substance) 102 when power is being supplied to the conductive rod 109 is 20 dB or more in as wide a frequency range as between 30 and 2500 MHz.

[Third Embodiment]

FIGS. 8(a) and 8(b) show the third embodiment of the leakage radiation preventing element according to the present invention. In FIGS. 8(a) and 8(b), the element is composed of the conductive disk 101, two ferrite rings 102-1 and 102-2 each having a different thickness, the capacitance portion 103 extending radially outward from the conductive disk 101, the insulating substance 105, the conductive rod 109, etc. Further, in FIG. 8(a), the wall surface (chassis surface) 106 of the casing of an electronic appliance is formed with the hole 107 for passing the conductive rod 109. Further, 108 denotes the inside of the casing.

In this third embodiment, the ferrite ring 102-1 having an axial thickness tm1 and a radial width Wm1 is disposed on the side of the casing wall surface 106, and the ferrite ring 102-2 having an axial thickness tm2 and a radial width Wm2 is disposed on the side of the conductive disk 101. The axial thickness tm1 of the ferrite ring 102-1 is thinner than that tm2 of the ferrite ring 102-2. On the other hand, the radial width Wm1 of the ferrite ring 102-1 is wider than that Wm2 of the ferrite ring 102-2.

In this embodiment, since power is supplied to the inside 108 of the casing through the conductive rod 109, the leakage radiation preventing element according to the present invention is used to prevent high frequency radio waves from being leaked through a gap 107 for passing the conductive rod 109 from the inside 108 of the casing. Further, the frequency band of this third embodiment is determined wider than that of the second embodiment.

In FIG. 8(a), the power is supplied for the appliance from the left side of the conductive rod 109. Here, since the conductive rod 109 is soldered to the center of the conductive disk 101, leakage current flows radially from the center of the conductive disk 101 along the surface of the conductive disk 101; turns to the reverse side of the conductive disk 101 (i.e., to the side of the two ferrite rings 102-1 and 102-2) passing through the outer circumference of the capacitance portion 103; enters the conductive rod 109 passing through the ferrite ring 102-1; and then flows to the inside 108 of the casing through the conductive rod 109 passing through the hole 107 formed in the casing wall surface 106.

Accordingly, although not shown, since the exposed portion of the conductive rod 109 and the conductive disk 101 are the charged portion, it is necessary to cover the preventing element by use of an insulating substance of an appropriate shape for safety.

In FIGS. 8(a) and 8(b), the conductive disk 101 for constructing the wave guide path has a diameter of 29.2 mm, and the space d between the conductive disk 101 and the casing wall surface (chassis) is set to 2 mm. Further, a capacitance portion 103 having a radial length lc of 5 mm is formed at a radially outward end portion of the conductive disk 101 concentrically therewith. Here, the space dc between the conductive disk 101 and the casing wall surface 106 is 0.1 mm and filled with an insulating substance 105.

The material of both the ferrite rings 102-1 and 102-2 is NiZn sintered ferrite having a relative permeability $\mu_r$ of 2500 and a relative dielectric constant $\epsilon_r$ of 15.

The ferrite ring 102-1 is a ring formed with a central hole having a diameter of about 0.6 mm. The axial thickness tm1 of the ferrite ring 102-1 is 0.48 mm and the outer diameter thereof is 20.6 mm. Further, the ferrite ring 102-2 is a ring having an outer diameter of about 29.2 mm and an inner diameter of 20.6 mm. The thickness tm2 of the ferrite ring 102-2 is 1.8 mm. Further, the outer diameter of the ferrite ring 102-1 is fitted to the inner diameter of the ferrite ring 102-2.

Therefore, the radial width Wm1 of the ferrite ring 102-1 is 10.0 mm, and the radial width Wm2 of the ferrite ring 102-2 is 4.3 mm. Further, there exists a gap dg1 of 1.38 mm in the thickness direction of the ferrite ring 102-1 between the ferrite ring 102-1 and the conductive disk 101. On the other hand, there exists no gap between the ferrite ring 102-2 and the conductive disk 101. However, there exists a gap dg2 of 0.2 mm between the ferrite ring 102-2 and the casing wall surface 106 in the same way as that of the ferrite ring 102-1. Both the ferrite rings 102-1 and 102-2 are in tight contact with the casing wall surface 106 via the insulating substance 105 formed of urethane foam having a dielectric constant of 1.2.

In the above-mentioned construction, the equivalent relative permeability $\epsilon_{er}$ of the ferrite ring 102-1 in the wave guide path is about 601, and the equivalent relative dielectric constant $\epsilon_{er}$ in the wave guide path is about 1.3. Further, the equivalent relative permeability $\mu_{er}$ of the ferrite ring 102-2 is about 2250, and the equivalent relative dielectric constant $\epsilon_{er}$ thereof is about 6.25. Further, the capacitance at the radial end portion of the conductive disk 101 is about 30 pF.

Figure 9:
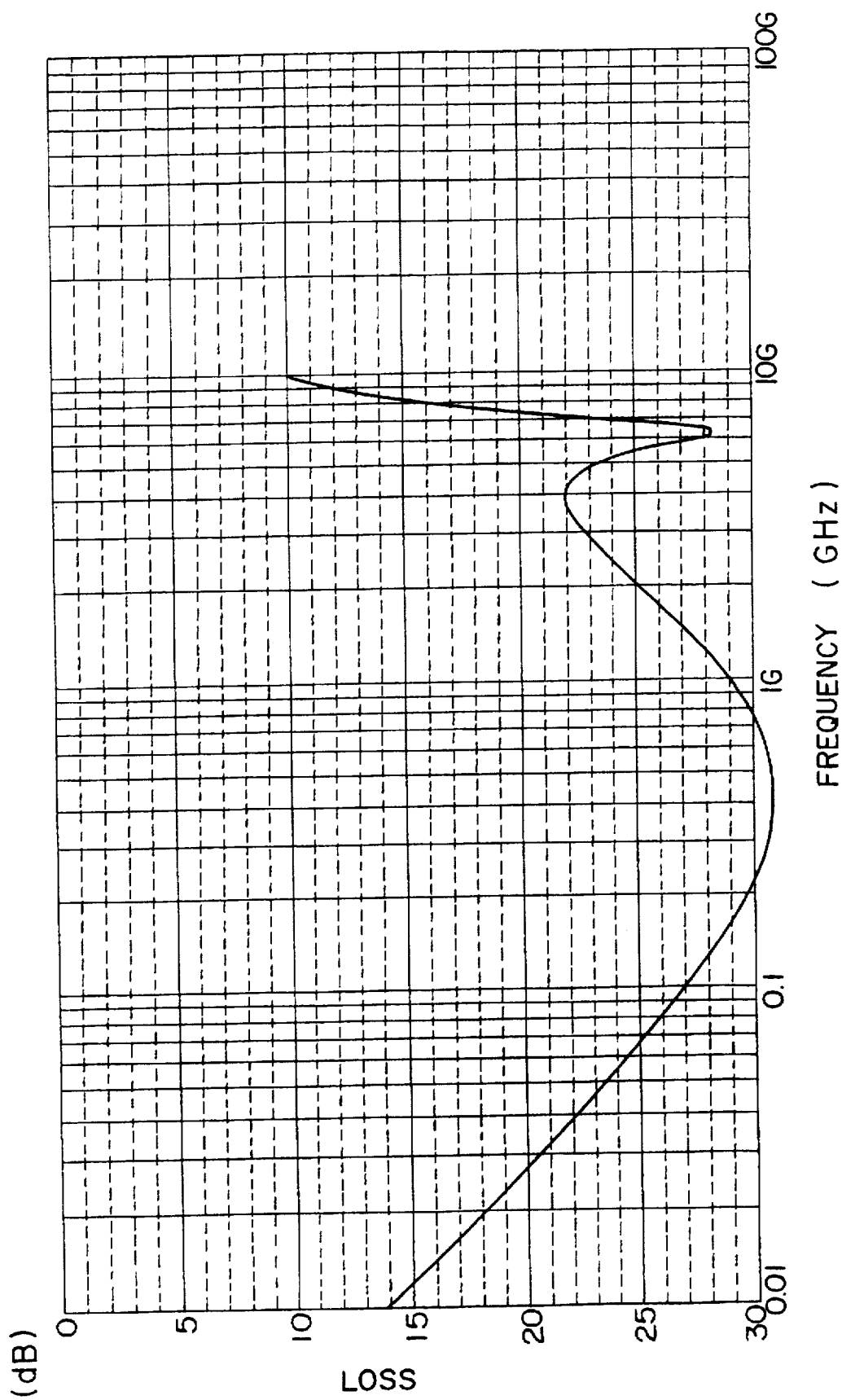
FIG. 9 is a graphical representation showing the actual reflective attenuation characteristics of the third embodiment shown in FIGS. 8(a) and 8(b)

FIG. 9 shows the absorption characteristics of the leakage radiation preventing element (absorption wall) constructed as shown in FIGS. 8(a) and 8(b). FIG. 9 indicates that the return loss of the radio waves propagating in the radial direction to the capacitance portion 103 through the two-stage ferrite rings 102-1 and 102-2 when power is being supplied to the conductive rod 109 is 20 dB or more in as wide a frequency range as between 27 and 7500 MHz.

[Fourth Embodiment]

FIGS. 10(a) and 10(b) show the fourth embodiment of the leakage radiation preventing element according to the present invention. In FIGS. 10(a) and 10(b), the preventing element is composed of the conductive disk 101, the ferrite rings 102, the capacitance portion 103 extending from the conductive disk 101, the insulating substance 105, the conductive rod 109, etc. Further, in FIG. 10(a), the wall surface (chassis surface) 106 of the casing of an electronic appliance is formed with the hole 107 for passing the conductive rod 109. Further, 108 denotes the inside of the casing.

This fourth embodiment is different from the second embodiment in that the ferrite ring 102 is divided into two sectors 102-1 and 102-2, as shown in FIG. 10(b). Further, the conductive disk 101 connected to the conductive rod 109 is partially inserted in the axial direction into the boundary portions between the two divided sectors 102-1 and 102-2 so as to reach the surface of the insulating substance 105.

The function of this forth embodiment is basically the same as with the case of the second embodiment. However, there still exists a difference between the two as follows: In the case of the second embodiment, when power is supplied to the inside 108 of the casing through the conductive rod 109, since the conductive rod 109 is passed through the central hole formed in the ferrite ring 102, magnetic flux is generated in the ferrite ring 102. In this case, since the ferrite ring 102 forms a closed magnetic path, when the magnetic flux density saturates due to a large current rate, there exists a problem in that the function as a magnetic substance 102 deteriorates.

To overcome this problem, in this fourth embodiment, the ferrite ring 102 is divided into two sectors by forming two slits therein, so that a closed magnetic path cannot be formed to prevent the ferrite from being saturated by the magnetic flux generated by the current.

In the fourth embodiment constructed as above, it is possible to obtain the same function against the radio waves leaked from the casing as with the case of the second embodiment. Further, in this fourth embodiment, although the ferrite ring 102 is divided by forming two slits, it is of course possible to obtain the similar effect by dividing the ferrite ring 102 into two by forming at least one slit, as far as the magnetic saturation can be prevented.

In FIGS. 10(a) and 10(b), the conductive disk 101 for constructing the wave guide path has a diameter of 15.8 mm, and the space d between the conductive disk 101 and the casing wall surface (chassis) is set to 2 mm. Further, the slit width is set to 0.5 mm. Further, the capacitance portion 103 having a radial length lc of 5 mm is formed at a radially outward end portion of the conductive disk 101 concentrically therewith. Here, the space dc between the conductive disk 101 and the casing wall surface 106 is 0.1 mm and filled with the insulating substance 105.

The material of both the ferrite rings 102-1 and 102-2 is NiZn sintered ferrite having a relative permeability $\mu_r$ of 2500 and a relative dielectric constant $\epsilon_r$ of 15.

The two sectors 102-1 and 102-2 of the ferrite ring 102 are formed by separating a ferrite ring formed with a central hole having a diameter of about 0.6 mm into one quarter 102-2 and three quarters 102-1 via two slits. Further, two conductive plates having a thickness of about 0.5 mm and extending from the conductive disk 101 in the axial direction thereof are inserted deep into these two slits so as to reach the insulating substance 105. Further, both the ferrite rings 102-1 and 102-2 are in tight contact with the conductive disk 101 in the axial thickness direction thereof, but in tight contact with the casing wall surface 106 via the insulating substance 105 having a thickness dc of 0.4 mm, as shown in FIG. 10(b). The axial thickness tm of the ferrite ring 102 is 1.6 mm and the radial width Wm thereof is 7.6 mm.

In the above-mentioned construction, the equivalent relative permeability $\mu_{er}$ in the wave guide path is about 2000, and the equivalent relative dielectric constant $\epsilon_{er}$ in the wave guide path is about 4. Further, the capacitance at the radially outward end portion of the conductive disk 101 is about 30 pF.

Figure 11:
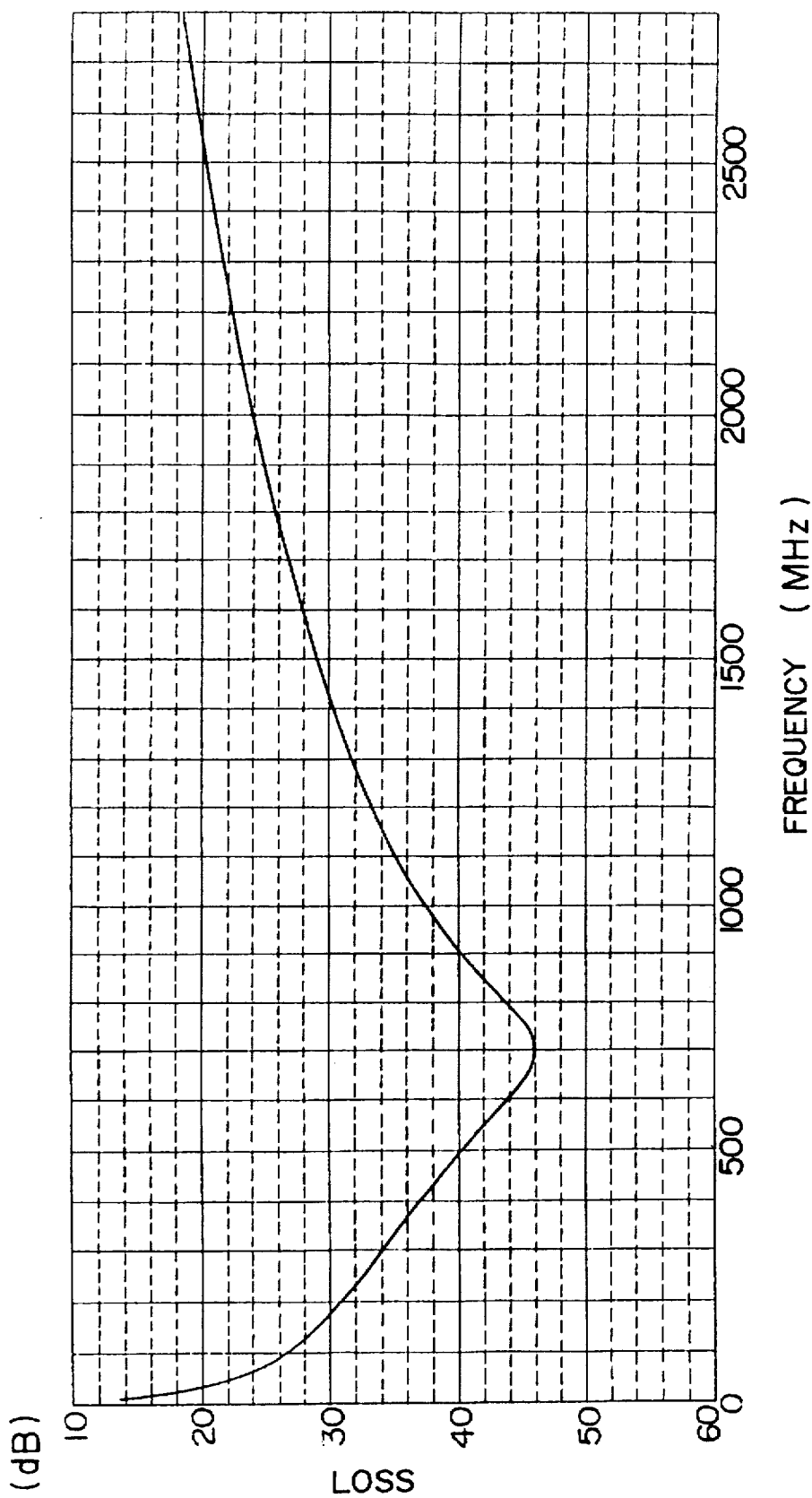
FIG. 11 is a graphical representation showing the actual reflective attenuation characteristics of the fourth embodiment shown in FIGS. 10(a) and 10(b)

FIG. 11 shows the absorption characteristics of the leakage radiation preventing element (absorption wall) constructed as shown in FIGS. 10(a) and 10(b). FIG. 11 indicates that the return loss of the radio waves propagating in the radial direction to the capacitance portion 103 through the two divided ferrite rings 102-1 and 102-2 when power is being supplied to the conductive rod 109 is 20 dB or more in as wide a frequency range as between 30 and 2500 MHz.

In the above-mentioned first, second and third embodiments, although the sintered ferrite has been used as the magnetic substance, it is also possible to use the magnetic substance formed by mixing ferrite powder with plastic, according to the frequency band in which the leakage radiation must be prevented. In general, however, when the equivalent permeability is high, since the leakage radiation preventing effect can be increased beginning from the lower frequency and further the width of the magnetic substance can be reduced, it is preferable to use a magnetic substance having a high permeability.

Further, in the third embodiment shown in FIG. 8(a), the equivalent permeability of the first stage is set lower to that of the second stage. In the case of the magnetic substances of multi-stage structure, when the equivalent permeability of the first stage is determined lower than that of the second stage; that is, when the equivalent permeability of the multi-stage magnetic substance is increased gradually in the order of the first stage, the second stage, the third stage, . . . , although the operable frequency increases, it is possible to construct the leakage radiation preventing element of wider band, as compared with the case where the thickness of the magnetic substance is determined constant in the wave guide path.

Further, in the leakage radiation preventing element according to the present invention, the conductive disk, the ferrite ring, etc. are all formed into circular or cylindrical shape. Without being limited only thereto, however, any shapes can be adopted. In this case, however, it is necessary that the leakage current generated from the gap between the leakage radiation preventing element and the casing or chassis can be effectively introduced into the wave guide path and then absorbed by the magnetic substance arranged in the wave guide path. Accordingly, even when the shapes of the parts thereof are modified, it is possible to prevent the radiation from being leaked from holes or gaps of various shapes in diversified methods.

Further, in the leakage radiation preventing element of the present invention, it is preferable to construct the magnetic substances by use of ferrite of the same magnetic material, even in the case of the multi-stage structure from the economical standpoint. This is because when ferrite is molded by sintering ferrite powder temporarily, it is possible to mold the magnetic substances at the respective stages integral with each other at the same time, so that it is possible to reduce the cost thereof markedly, as compared with when the magnetic substances are manufactured separately at each stage by use of materials of different sorts.

Further, in the leakage radiation preventing element according to the present invention, although the size of the leakage radiation preventing element can be reduced by inserting an insulating material of high dielectric constant into the capacitance portion, the element size can be also reduced by disposing discrete capacitors at the outer circumference of the conductive disk.

As described above, in the leakage radiation preventing element according to the present invention, since one or a plurality of ferrite rings having a different axial thickness, respectively are used as the magnetic substance in such a way as to be arranged at a single stage or a multi-stage in the radial width direction thereof; since the ferrite rings are inserted between the conductive disk and the casing wall surface or the chassis; and since the wire and the coaxial cable is passed through the central portion of the ferrite rings so as to absorb the radiation leaked from the casing or the chassis, it is possible to effectively prevent undesired radio waves from being radiated along the lead-out portion of the electronic appliance.

Further, in the present invention, when the coaxial cable, the power line, the control lines, etc. are led out of the casing of the electronic appliance, since the lead-out situation is the same as with the case of the prior art protector, it is possible to use the leakage radiation preventing element according to the present invention, without modifying the prior art protector, in order to prevent radio waves from being radiated from the gap or holes formed in the casing.

What is claimed is:

1. A leakage radiation preventing element, comprising:
a coaxial conductor composed of an inner conductor and an outer conductor and disposed so as to pass through a chassis of an electronic appliance electrically insulated from the chassis;

a conductive disk connected to the outer conductor of said coaxial conductor and extending roughly in parallel to the chassis so as to form a space between said conductive disk and the chassis by surrounding said coaxial conductor concentrically; and a magnetic substance formed of ferrite and inserted in the space so as to surround said coaxial conductor concentrically.

2. The leakage radiation preventing element of claim 1, wherein a gap or a dielectric substance is inserted between the chassis and said conductive disk and further between the chassis and said magnetic substance.

3. The leakage radiation preventing element of claim 1, wherein an electric capacitance is additionally disposed between said conductive disk and the chassis.

4. A leakage radiation preventing element disposed between a cable television subscriber terminal and a lead-in wire so as to be used as a protector, which comprises:
a conductive disk attached concentrically to an outer conductor of a coaxial connector electrically insulated from a chassis or a casing of the protector; and
a magnetic substance interposed between said conductive disk and the chassis or the casing.

5. The leakage radiation preventing element of claim 4, wherein a gap or a dielectric substance is inserted between the chassis or the casing and said conductive disk and further between the chassis or the casing and said magnetic substance.

6. The leakage radiation preventing element of claim 4, wherein an electric capacitance is additionally disposed between said conductive disk and the chassis or the casing.

7. A leakage radiation preventing element, which comprises:
a ring-shaped magnetic substance formed with at least one slit extending in thickness direction or in radial direction thereof, the slit being filled with a conductive plate, and a wire led out of a casing of an electronic appliance to an outside of the casing being passed through a roughly central portion of said magnetic substance; and
a conductive disk arranged concentrically with said magnetic substance and connected to the conductive plate.

8. The leakage radiation preventing element of claim 7, wherein said magnetic substance is formed by arranging a plurality of magnetic substances having a different axial thickness, respectively at a multi-stage in a radial direction thereof.

9. A leakage radiation preventing element, comprising:
a conductor disposed to pass through a chassis of an electronic appliance, said conductor being electrically insulated from the chassis;
a conductive disk connected to said conductor and extending roughly in parallel to the chassis so as to form a space between said conductive disk and the chassis by surrounding said conductor concentrically; and
a magnetic substance formed of ferrite and inserted in the space so as to surround said conductor concentrically.

10. A leakage radiation preventing element of claim 9, wherein a gap or a dielectric substance is inserted between the chassis and said conductive disk and further between the chassis and said magnetic substance.

11. The leakage radiation preventing element of claim 9, wherein a capacitor is additionally disposed between said conductive disk and the chassis.

* * * * *